US008456333B1

(12) United States Patent
Semenyuk et al.

(10) Patent No.: US 8,456,333 B1
(45) Date of Patent: Jun. 4, 2013

(54) ADVANCED SOLID BLOCK SPLITTING FOR LOSSLESS DATA COMPRESSION

(75) Inventors: Vladimir Semenyuk, Pacific Grove, CA (US); Serge Volkoff, San Bruno, CA (US)

(73) Assignee: Smith Micro Software, Inc., Aliso Viejo, CA (US)

( * ) Notice: Subject to any disclaimer, the term of this patent is extended or adjusted under 35 U.S.C. 154(b) by 49 days.

(21) Appl. No.: 13/280,252

(22) Filed: Oct. 24, 2011

Related U.S. Application Data

(60) Provisional application No. 61/406,070, filed on Oct. 22, 2010.

(51) Int. Cl.
*H03M 7/40* (2006.01)
(52) U.S. Cl.
USPC .............. 341/65; 341/51; 341/67; 341/106; 341/107
(58) Field of Classification Search
USPC ................... 341/50, 51, 65, 67, 106, 107
See application file for complete search history.

(56) References Cited

U.S. PATENT DOCUMENTS

| 5,717,394 | A * | 2/1998 | Schwartz et al. | 341/51 |
|---|---|---|---|---|
| 6,678,419 | B1 * | 1/2004 | Malvar | 382/240 |
| 6,895,101 | B2 * | 5/2005 | Celik et al. | 382/100 |
| 7,126,506 | B2 * | 10/2006 | Malvar | 341/63 |
| 7,286,710 | B2 * | 10/2007 | Marpe et al. | 382/239 |
| 7,379,608 | B2 * | 5/2008 | Marpe et al. | 382/247 |
| 7,417,570 | B2 | 8/2008 | Srinivasan et al. | |
| 7,421,138 | B2 * | 9/2008 | Van Der Vleuten | 382/244 |
| 7,580,585 | B2 * | 8/2009 | Malvar | 382/245 |
| 7,770,091 | B2 | 8/2010 | Monro | |
| 7,796,058 | B2 | 9/2010 | Winter | |
| 7,845,571 | B2 | 12/2010 | Monro | |
| 7,872,596 | B2 | 1/2011 | Schneider | |
| 7,925,639 | B2 | 4/2011 | Vo et al. | |
| 8,335,253 | B2 * | 12/2012 | Marpe et al. | 375/240.12 |
| 2009/0122868 | A1 * | 5/2009 | Chen et al. | 375/240.22 |

* cited by examiner

*Primary Examiner* — Linh Nguyen
(74) *Attorney, Agent, or Firm* — Craig M. Stainbrook; Stainbrook & Stainbrook, LLP

(57) ABSTRACT

A method of separating data blocks with stationary informational characteristics, including the steps of sequentially collecting statistics for small data blocks in an input data set, calculating the relative change in the estimated compression efficiency for a solid block currently being formed caused by merging its statistics with the statistics of a next small block, deciding whether the small block should be added to the solid block; for any block for which the decision is no, the block is used as the starting block of the next solid block to be formed. Auxiliary block data type detection is used to improve the method.

10 Claims, 2 Drawing Sheets

ADVANCED SOLID BLOCK SPLITTING FOR LOSSLESS DATA COMPRESSION

BACKGROUND OF THE INVENTION

1. Field of the Invention

The present invention relates to the area of lossless data compression. More specifically, the present invention relates to a method for detecting and separating data blocks with stationary informational characteristics as a preliminary stage for lossless data compression.

2. Background Discussion

Lossless compression is a process of economically representing source information. Lossless compression methods are used in many areas, principally in data storage and data transmission, and improved coding techniques are continually sought to reduce the amount of memory required to store data and/or to increase the amount of data that can be transmitted over a communications channel in a given amount of time. As a general rule, lossless compression methods are more efficient when applied to particular types of data they are specifically designed to compress. Furthermore, many compression methods are sensitive to changes in data characteristics. Detecting and separating data blocks of a particular type with stationary informational characteristics (solid block splitting) is a very important preliminary stage in many compression technologies, especially those operating on independent blocks (such as Burrows-Wheeler compression).

There have been several efforts to implement an intelligent data block detection mechanism. However, while data type detection is more or less successful in most cases, existing solid block splitting solutions are less than satisfactory.

A widely used and straightforward approach to solid block splitting works as follows: Small portions, or blocks (b), of data within an input data set are consecutively analyzed, and decisions are made on whether they should be added to a solid block (B) currently being formed. If not, a rejected block is considered to be the beginning of the next solid block to be formed. The decision is usually based on a comparison function F(B, b) and a threshold δ:

$$F(B,b) \leq \delta \Rightarrow B = B+b.$$

The following terms have the definitions set out below.

N—alphabet size;

X∈{B, b}—block;

$X_\Sigma$—the number of symbols in block X;

$X_{sym}$—the number of times symbol, sym, appears in block X;

S—the number of different possible statistical states (statistical states allow the use of comprehensive context-based estimations);

$X^{st}$—the number of times statistical state st appears in block X;

$X_{sym}^{st}$—the number of times symbol sym appears in statistical state st within block X;

$p_{sym}^{st}(\{X_j^i\}_{i \in \{1,K,S\}, j \in \{1,K,N\}})$—estimated probability of symbol sym appearing in state st within block X;

$p^{st}(\{X_j^i\}_{i \in \{1,K,S\}, j \in \{1,K,N\}})$—estimated probability of state st appearing within block X.

The following formulas describe evident relations between these quantities:

$$X_\Sigma = \sum_{sym}^N X_{sym} = \sum_{st=1}^S X^{st}, \; X^{st} = \sum_{sym=1}^N X_{sym}^{st}, \; X_{sym} = \sum_{st=1}^S X_{sym}^{st}.$$

In most cases, probability estimations are calculated using the following two formulas:

$$p_{sym}^{st}(\{X_j^i\}_{i \in \{1,K,S\}, j \in \{1,K,N\}}) = \frac{\alpha_1 \cdot X_{sym}^{st} + 1}{\alpha_1 \cdot X^{st} + N},$$

$$p^{st}(\{X_j^i\}_{i \in \{1,K,S\}, j \in \{1,K,N\}}) = \frac{\alpha_2 \cdot X^{st} + 1}{\alpha_2 \cdot X_\Sigma + T}, \; \alpha_1, \alpha_2 \geq 0.$$

Collected statistics may be insufficient if blocks are small but the number of states is large. Therefore, it may be impossible to estimate probabilities reliably. High computational complexity is also a problem, because recalculating probabilities for every block may be unacceptable. With increasing block size, the complexity problem may diminish and probability estimation becomes more precise, but block splitting efficiency still cannot be guaranteed as relatively large blocks cannot precisely separate small areas of data with stationary informational characteristics.

In practical data compression technologies, a state-based approach is rarely applied. In many cases it is assumed that S=1, and calculations are based on a simplified formula:

$$p_{sym}(\{X_j\}_{j \in \{1,K,N\}}) = \frac{\beta \cdot X_{sym} + 1}{\beta \cdot X_\Sigma + N}, \; \beta \geq 0.$$

Such simplification leads to a performance tradeoff: it reduces computational complexity but may negatively affect the precision of block splitting.

The following two comparison functions are usually employed in practice:

$$F(B, b) = \left| 1 - \frac{\sum_{st=1}^S p^{st}(\{b_j^i\}_{i \in \{1,K,T\}, j \in \{1,K,N\}}) \sum_{sym=1}^N p_{sym}^{st}(\{b_j^i\}_{i \in \{1,K,S\}, j \in \{1,K,N\}}) \cdot \ln(p_{sym}^{st}(\{b_j^i\}_{i \in \{1,K,S\}, j \in \{1,K,N\}}))}{\sum_{st=1}^S p^{st}(\{B_j^i\}_{i \in \{1,K,T\}, j \in \{1,K,N\}}) \sum_{sym=1}^N p_{sym}^{st}(\{B_j^i\}_{i \in \{1,K,S\}, j \in \{1,K,N\}}) \cdot \ln(p_{sym}^{st}(\{B_j^i\}_{i \in \{1,K,S\}, j \in \{1,K,N\}}))} \right|,$$

$$F(B, b) = \frac{\sum_{st=1}^{S}(B^{st} + b^{st})\sum_{sym=1}^{N}(B_{sym}^{st} + b_{sym}^{st})\ln\left(p_{sym}^{st}\left(\{B_j^i + b_j^i\}_{i \in \{1,K,S\}, j \in \{1,K,N\}}\right)\right)}{\sum_{st=1}^{S}B^{st}\sum_{sym=1}^{N}\ln\left(p_{sym}^{st}\left(\{B_j^i\}_{i \in \{1,K,S\}, j \in \{1,K,N\}}\right)\right) + \sum_{st=1}^{S}b^{st}\sum_{sym=1}^{N}b_{sym}^{st}\ln\left(p_{sym}^{st}\left(\{b_j^i\}_{i \in \{1,K,S\}, j \in \{1,K,N\}}\right)\right)}.$$

The first function is a comparison of empirical entropies of blocks B and b. If entropies are close, blocks B and b are considered to be parts of one solid block. The second function is a comparison of two different estimations of the size of the compressed representation of blocks B and b. One estimation (in the numerator) assumes that blocks are compressed together, while the other estimation (in the denominator) assumes that blocks are compressed separately. The first function is easier to calculate, but the result of the comparison does not guarantee efficient block separation in terms of final compression efficiency. The second function, while requiring more computational resources, is more suitable for practical compression applications. Nevertheless, because of inaccurate probability estimation for small blocks b, splitting may give unpredictable results.

BRIEF SUMMARY OF THE INVENTION

The present invention is a method of separating data blocks with stationary informational characteristics. The invention employs a new comparison function, providing improved overall compression efficiency. The low complexity of the inventive method makes it more suitable for practical applications.

Certain portions of the detailed description set out below employ algorithms, arithmetic, or other symbolic representations of operations performed on data stored within a computing system. The nomenclature employed is common among those with skill in the art to communicate the substance of their understanding to others similarly skilled and knowledgeable. The operations discussed are performed on electrical and/or magnetic signals stored or capable of being stored, as bits, data, values, characters, elements, symbols, characters, terms, numbers, and the like, within the computer system processors, memory, registers, or other information storage, transmission, or display devices. The actions or processes involve the transformation of physical electronic and/or magnetic quantities within such storage, transmission, or display devices.

DETAILED DESCRIPTION OF THE INVENTION

The present invention follows the approach described in the Background Discussion, above, but uses a new comparison function, set out as follows:

$$F(B, b) = \frac{\sum_{st=1}^{S}B^{st}\sum_{sym=1}^{N}B_{sym}^{st}\ln\left(p_{sym}^{st}\left(\{B_j^i\}_{i \in \{1,K,S\}, j \in \{1,K,N\}}\right)\right) - \sum_{st=1}^{S}B^{st}\sum_{sym=1}^{N}B_{sym}^{st}\ln\left(p_{sym}^{st}\left(\{B_j^i + b_j^i\}_{i \in \{1,K,S\}, j \in \{1,K,N\}}\right)\right)}{b_{\Sigma}}.$$

This function calculates the relative change in the estimated compression efficiency for a solid block B caused by merging its statistics with the statistics of a block b and using the merged statistics (rather than the original statistics of the block B) for probability estimation.

The comparison function can be significantly simplified:

$$F(B, b) = \frac{\sum_{st=1}^{S}B^{st}\sum_{sym=1}^{N}B_{sym}^{st}\ln\left(\frac{p_{sym}^{st}\left(\{B_j^i\}_{i \in \{1,K,S\}, j \in \{1,K,N\}}\right)}{p_{sym}^{st}\left(\{B_j^i + b_j^i\}_{i \in \{1,K,S\}, j \in \{1,K,N\}}\right)}\right)}{b_{\Sigma}} = \frac{\sum_{st=1}^{S}\begin{cases}\sum_{sym=1}^{N}B_{sym}^{st}\ln\left(\frac{p_{sym}^{st}\left(\{B_j^i\}_{i \in \{1,K,S\}, j \in \{1,K,N\}}\right)}{p_{sym}^{st}\left(\{B_j^i + b_j^i\}_{i \in \{1,K,S\}, j \in \{1,K,N\}}\right)}\right), & b^{st} \neq 0\\ 0, & b^{st} = 0\end{cases}}{b_{\Sigma}}.$$

The computational complexity of this improved comparison function is significantly lower than the computational complexity of previously used functions. Practical implementation has shown that the inventive method outperforms all previous methods in terms of efficiency. This can be explained partly by the fact that the precision of the new comparison function does not significantly depend on the size of the block b.

As a further improvement, a new probability estimation function is employed:

$$p_{sym}^{st}\left(\{X_j^i\}_{i \in \{1,K,S\}, j \in \{1,K,N\}}\right) = \frac{\alpha \cdot X_{sym}^{st} + \beta \cdot X_{sym} + 1}{\alpha \cdot X^{st} + \beta \cdot X_{\Sigma} + N}, \alpha, \beta \geq 0.$$

This combination of state-based and state-independent approaches avoids the problems typical of both approaches when they are applied separately. The result is noticeably improved block splitting efficiency. Moreover, the inventive probability estimation technique does not incur a significant performance cost compared to standard probability estimations.

Another improvement comes from combining block splitting and data type detection procedures. When a new block b has been detected and the detection process has indicated that blocks B and b are of different types, further comparison of these blocks is not necessary and the block b is considered to be the beginning of the next solid block. This not only improves compression efficiency but also eliminates unnecessary calculations.

Figure 1:
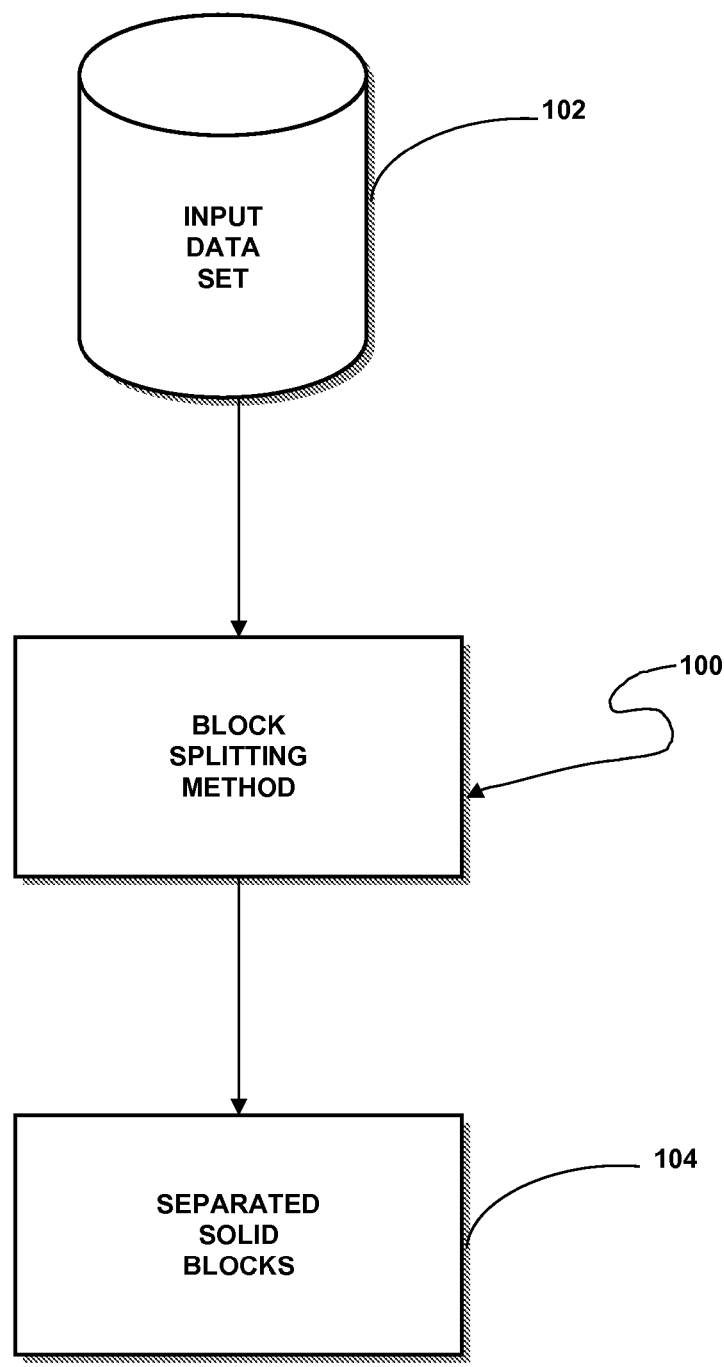
FIG. 1 is a schematic block diagram showing in highly abstract form a flow chart of the advanced solid block splitting method of the present invention.
Figure 2:
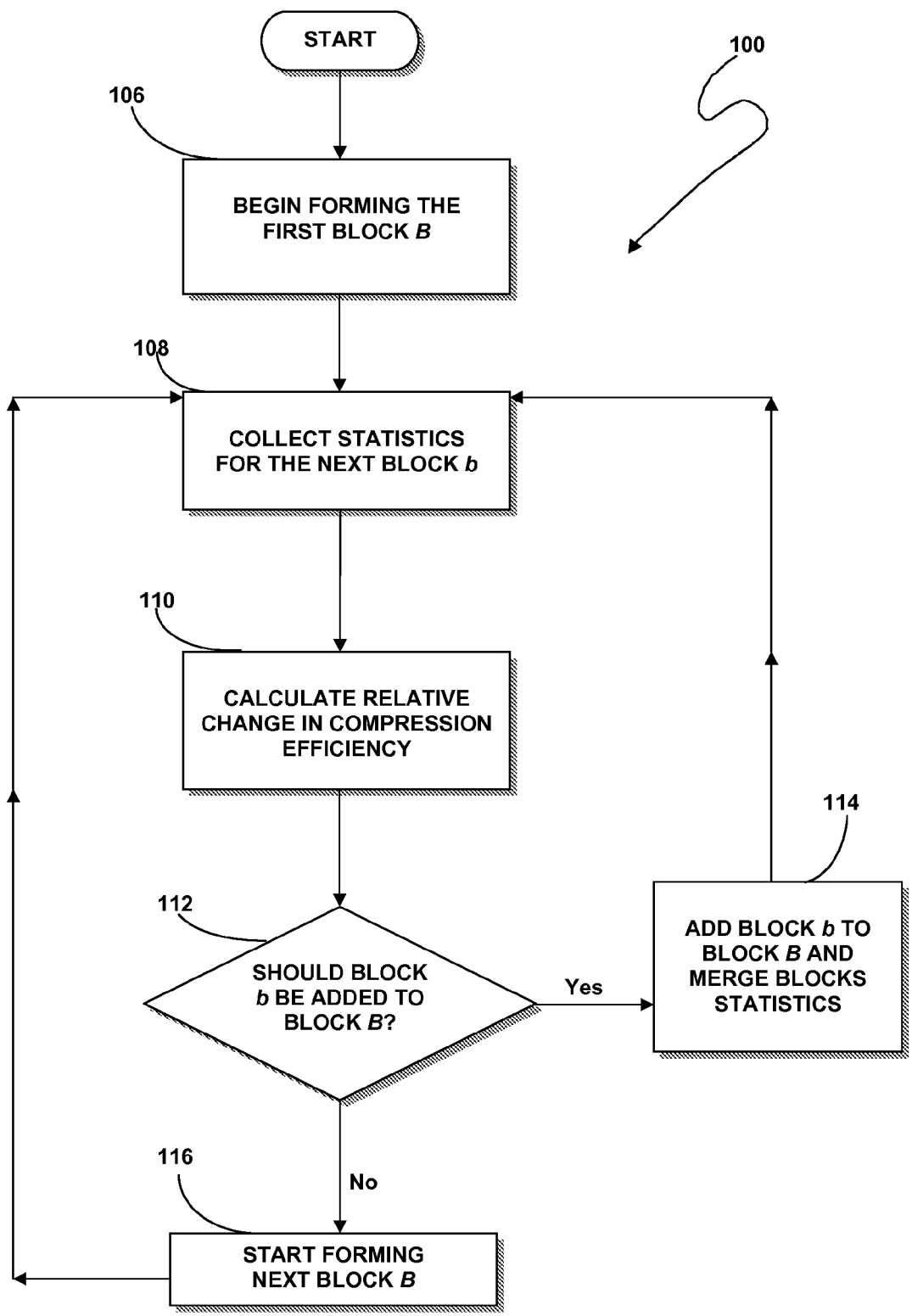
FIG. 2 is a schematic block diagram showing a flow chart of the method steps comprising the present invention.

From the foregoing, and by reference to FIGS. 1 and 2, it will be appreciated that the present invention is a method 100 of separating data blocks with stationary informational characteristics in an input data set 102 into discrete solid blocks 104. The method includes the steps of: (a) beginning the formation 106 of the first solid block (B) from the first small block (b) in the input set; (b) sequentially collecting statistics 108 for small blocks (b) in the input data set; (c) calculating 110 for each block b the relative change in the estimated compression efficiency for the solid block B currently being formed caused by merging the statistics of the block B with the statistics of the block b collected in step (b) and using the merged statistics to calculate a probability estimation; (d) deciding 112 in each case whether a block b should be added to a block B by comparing the relative change calculated in step (c) with a previously selected threshold; (e) for any block b for which the decision in step (d) is yes, adding 114 the block b to the solid block B and merging the statistics of the block B with the statistics of the block b; and (f) for any block b for which the decision in step (d) is no, considering the current solid block B formed and using 116 the rejected block as the starting block of the next solid block B to be formed.

What is claimed as invention is:

1. A method of separating solid data blocks with stationary informational characteristics in an input data set, comprising the steps of:
   (a) beginning the formation of the first solid block (B) from the first small block (b) in a sequence of small blocks in the input data set;
   (b) sequentially collecting statistics for small blocks b in the input data set;
   (c) calculating for each block b the relative change in the estimated compression efficiency for the solid block B currently being formed caused by merging the statistics of the block B with the statistics of the block b collected in step (b) and using the merged statistics for probability estimation;
   (d) deciding in each case whether any block b should be added to a block B by comparing the relative change calculated in step (c) with a previously selected threshold;
   (e) for any block b for which the decision in step (d) is yes, adding the block b to the solid block B and merging the statistics of the block B with the statistics of the block b; and
   (f) for any block b for which the decision in step (d) is no, considering the current solid block B formed and using the rejected block as the starting block of the next solid block to be formed.

2. The method of claim 1, wherein step (c) uses a comparison function F(B, b) for calculating the relative change of the form:

$$F(B, b) = \frac{\sum_{st=1}^{S} B^{st} \sum_{sym=1}^{N} B_{sym}^{st} \ln\left(p_{sym}^{st}(\{B_j^i\}_{i\in\{1,K,S\},j\in\{1,K,N\}})\right) - \sum_{st=1}^{S} B^{st} \sum_{sym=1}^{N} B_{sym}^{st} \ln\left(p_{sym}^{st}(\{B_j^i + b_j^i\}_{i\in\{1,K,S\},j\in\{1,K,N\}})\right)}{b_\Sigma}.$$

3. The method of claim 2, wherein the comparison function is simplified as:

$$F(B, b) = \frac{\sum_{st=1}^{S} B^{st} \sum_{sym=1}^{N} B_{sym}^{st} \ln\left(\frac{p_{sym}^{st}(\{B_j^i\}_{i\in\{1,K,S\},j\in\{1,K,N\}})}{p_{sym}^{st}(\{B_j^i + b_j^i\}_{i\in\{1,K,S\},j\in\{1,K,N\}})}\right)}{b_\Sigma} =$$

$$\frac{\sum_{st=1}^{S} \begin{cases} \sum_{sym=1}^{N} B_{sym}^{st} \ln\left(\frac{p_{sym}^{st}(\{B_j^i\}_{i\in\{1,K,S\},j\in\{1,K,N\}})}{p_{sym}^{st}(\{B_j^i + b_j^i\}_{i\in\{1,K,S\},j\in\{1,K,N\}})}\right), & b^{st} \neq 0 \\ 0, & b^{st} = 0 \end{cases}}{b_\Sigma}.$$

4. The method of claim 2, wherein step (c) uses a probability estimation formula of the form:

$$p_{sym}^{st}(\{X_j^i\}_{i\in\{1,K,S\},j\in\{1,K,N\}}) = \frac{\alpha \cdot X_{sym}^{st} + \beta \cdot X_{sym} + 1}{\alpha \cdot X^{st} + \beta \cdot X_\Sigma + N}, \alpha, \beta \geq 0.$$

5. The method of claim 1, further including a data type detection procedure, wherein when a new small block b has been detected and its data type differs from the data type of the solid block B currently being formed, steps (c), (d) are omitted and the decision to be made in step (d) is assumed to be yes.

6. A physical non-transitory computer readable medium with computer-executable instructions stored thereon that cause a computing device to perform the method of separating solid data blocks with stationary informational characteristics in an input data set, comprising the steps of:
   (a) beginning the formation of the first solid block (B) from the first small block (b) in the input set;
   (b) sequentially collecting statistics for small blocks (b) in the input data set;
   (c) calculating for each block b the relative change in the estimated compression efficiency for the solid block B currently being formed caused by merging the statistics of the block B with the statistics of the block b collected in step (b) and using the merged statistics for probability estimation;
   (d) deciding in each case whether a block b should be added to a block B comparing the relative change calculated in step (c) with a priory selected threshold;
   (e) for any block b for which the decision in step (d) is yes, adding the block b to the solid block B and merging the statistics of the block B with the statistics of the block b; and
   (f) for any block b for which the decision in step (d) is no, considering the current solid block B formed and using the rejected block as the starting block of the next solid block to be formed.

7. The steps of claim 6, wherein step (c) uses a comparison function F(B, b) for calculating the relative change of the form:

$$F(B, b) = \frac{\sum_{st=1}^{S} B^{st} \sum_{sym=1}^{N} B_{sym}^{st} \ln\left(p_{sym}^{st}(\{B_j^i\}_{i\in\{1,K,S\},j\in\{1,K,N\}})\right) - \sum_{st=1}^{S} B^{st} \sum_{sym=1}^{N} B_{sym}^{st} \ln\left(p_{sym}^{st}(\{B_j^i + b_j^i\}_{i\in\{1,K,S\},j\in\{1,K,N\}})\right)}{b_\Sigma}.$$

8. The steps of claim 7, wherein the comparison function is simplified as:

$$F(B, b) = \frac{\sum_{st=1}^{S} B^{st} \sum_{sym=1}^{N} B_{sym}^{st} \ln\left(\frac{p_{sym}^{st}(\{B_j^i\}_{i\in\{1,K,S\},j\in\{1,K,N\}})}{p_{sym}^{st}(\{B_j^i + b_j^i\}_{i\in\{1,K,S\},j\in\{1,K,N\}})}\right)}{b_\Sigma} =$$

$$\frac{\sum_{st=1}^{S} \begin{cases} \sum_{sym=1}^{N} B_{sym}^{st} \ln\left(\frac{p_{sym}^{st}(\{B_j^i\}_{i\in\{1,K,S\},j\in\{1,K,N\}})}{p_{sym}^{st}(\{B_j^i + b_j^i\}_{i\in\{1,K,S\},j\in\{1,K,N\}})}\right), & b^{st} \neq 0 \\ 0, & b^{st} = 0 \end{cases}}{b_\Sigma}.$$

9. The steps of claim 7, wherein step (c) uses a probability estimation formula of the form:

$$p_{sym}^{st}(\{X_j^i\}_{i\in\{1,K,S\},j\in\{1,K,N\}}) = \frac{\alpha \cdot X_{sym}^{st} + \beta \cdot X_{sym} + 1}{\alpha \cdot X^{st} + \beta \cdot X_\Sigma + N}, \alpha, \beta \geq 0.$$

10. The steps of claim 6, further including a data type detection procedure, wherein when a new small block b has been detected and its data type differs from the data type of the solid block B currently being formed, steps (c), (d) are omitted and the decision to be made in step (d) is assumed to be yes.

* * * * *